United States Patent
Storck et al.

(10) Patent No.: US 9,691,632 B2
(45) Date of Patent: Jun. 27, 2017

(54) EPITAXIAL WAFER AND A METHOD OF MANUFACTURING THEREOF

(71) Applicants: SILTRONIC AG, Munich (DE); INTEL CORPORATION, Santa Clara, CA (US)

(72) Inventors: Peter Storck, Burghausen (DE); Norbert Werner, Tengling (DE); Martin Vorderwestner, Unterreit (DE); Peter Tolchinsky, Beaverton, OR (US); Irwin Yablok, Portland, OR (US)

(73) Assignees: Siltronic AG, Munich (DE); Intel Corporation, Santa Clara, CA (US)

( * ) Notice: Subject to any disclaimer, the term of this patent is extended or adjusted under 35 U.S.C. 154(b) by 0 days.

(21) Appl. No.: 14/649,114

(22) PCT Filed: Dec. 3, 2013

(86) PCT No.: PCT/EP2013/075313
§ 371 (c)(1),
(2) Date: Jun. 2, 2015

(87) PCT Pub. No.: WO2014/086742
PCT Pub. Date: Jun. 12, 2014

(65) Prior Publication Data
US 2015/0303071 A1    Oct. 22, 2015

Related U.S. Application Data

(60) Provisional application No. 61/733,977, filed on Dec. 6, 2012.

(51) Int. Cl.
*H01L 21/322*    (2006.01)
*H01L 29/167*    (2006.01)
*H01L 21/02*    (2006.01)

(52) U.S. Cl.
CPC ...... *H01L 21/3225* (2013.01); *H01L 21/0254* (2013.01); *H01L 21/0257* (2013.01);
(Continued)

(58) Field of Classification Search
CPC ........... H01L 21/3225; H01L 21/02381; H01L 21/02532; H01L 21/0254; H01L 21/0257;
(Continued)

(56) References Cited

U.S. PATENT DOCUMENTS 6,274,442 B1    8/2001    Gardner et al.
6,548,886 B1    4/2003    Ikari et al.
(Continued)

FOREIGN PATENT DOCUMENTS

EP    0 265 988 A1    5/1988
JP    61125012 A    6/1986
(Continued)

OTHER PUBLICATIONS

Akatsuka, Masanori et al., "Pinning Effect of Punched_out Dislocations in Carbon-, Nitrogen- or Boron-Doped Silicon Wafers," Japanese Journal of Applied Physics (JJAP), vol. 40 (2001) pp. 1240-1241.
(Continued)

*Primary Examiner* — Whitney T Moore
(74) *Attorney, Agent, or Firm* — Brooks Kushman P.C.

(57) ABSTRACT

An epitaxial wafer comprises a silicon substrate wafer having first and second sides, and a silicon epitaxial layer deposited on the first side, and optionally one or more additional epitaxial layers on top of the silicon epitaxial layer, at least one of the silicon epitaxial layer or at least one of the one or more additional epitaxial layers being doped with nitrogen at a concentration of $1 \times 10^{16}$ atoms/cm$^3$ or more and $1 \times 10^{20}$ atoms/cm$^3$ or less. The epitaxial wafer is produced by depositing the silicon epitaxial layer and/or at least one of the one or more additional epitaxial layers, at a deposition temperature of 940° C. or less through chemical vapor deposition in the presence of a deposition gas atmosphere containing one or more silicon precursor compounds and one or more nitrogen precursor compounds.

20 Claims, 4 Drawing Sheets

(52) U.S. Cl.
CPC .... *H01L 21/0262* (2013.01); *H01L 21/02381* (2013.01); *H01L 21/02532* (2013.01); *H01L 21/02573* (2013.01); *H01L 21/3221* (2013.01); *H01L 29/167* (2013.01)

(58) Field of Classification Search
CPC ........... H01L 21/02573; H01L 21/0262; H01L 21/3221; H01L 29/167
See application file for complete search history.

(56) References Cited

U.S. PATENT DOCUMENTS

| | | |
|---|---|---|
| 2005/0066892 A1 | 3/2005 | Dip et al. |
| 2006/0175613 A1 | 8/2006 | Lee et al. |
| 2006/0289873 A1* | 12/2006 | Rowland ........... H01L 21/02447 257/77 |
| 2009/0226736 A1 | 9/2009 | Kurita et al. |
| 2010/0151692 A1 | 6/2010 | Ono et al. |
| 2011/0300371 A1 | 12/2011 | Omote et al. |

FOREIGN PATENT DOCUMENTS

| | | |
|---|---|---|
| JP | 2007-507885 A | 3/2007 |
| JP | 2007073820 A | 3/2007 |
| JP | 2009200231 A | 9/2009 |
| TW | 201145357 A1 | 12/2011 |

OTHER PUBLICATIONS

Pichler, Peter, "Intrinsic Point Defects, Impurities, and Their Diffusion in Silicon," 2004 Spinger-Verlag/Wien, p. 383.

* cited by examiner

EPITAXIAL WAFER AND A METHOD OF MANUFACTURING THEREOF

CROSS REFERENCE TO RELATED APPLICATIONS

This application is the U.S. National Phase of PCT Appln. No. PCT/EP2013/075313 filed Dec. 3, 2013, which claims the benefit of 61/733,977 filed Dec. 6, 2012, the disclosures of which are incorporated in their entirety by reference herein.

BACKGROUND OF THE INVENTION

1. Field of the Invention

The claimed invention is directed to an epitaxial wafer and to a method for producing the epitaxial wafer.

2. Description of the Related Art

Epitaxial wafers comprise a silicon substrate wafer having a first side and a second side, and a silicon epitaxial layer deposited on the first side of the silicon substrate wafer. Such wafers are prepared by depositing the silicon epitaxial layer on the first side of the silicon substrate wafer by chemical vapor deposition (CVD). Epitaxial wafers are used for manufacturing semiconductor devices such as memory devices and microprocessors.

Miniaturization of electronic device structures like transistors is in progress and amplifies several problems. It becomes more likely that dislocations caused by stress fields will damage or even destroy electronic device structures.

Accordingly, attempts have been made to strengthen the epitaxial layer against dislocation nucleation and propagation. US 2010/0151692 A1 proposes to subject the epitaxial wafer to a heat treatment under a non-oxidizing atmosphere such that the oxygen concentration of the surface of the silicon epitaxial layer is set to $1.0 \times 10^{17}$ to $12 \times 10^{17}$ atoms/cm$^3$. It is believed that raising the oxygen concentration in the epitaxial layer improves the resistance to dislocation generation.

Another problem concerns metallic impurities which have a detrimental effect on the functional integrity of electronic devices. Attempts have been made to keep such impurities away from electronic device structures by providing gettering sites which are sinks for metallic impurities. Recent developments require shifting such gettering sites closer to the electronic device structures in order to reduce the diffusion length which impurities have to cover in order to reach the gettering sites.

US 2006/0175613 A1 discloses a method comprising growing a gettering layer over a semiconductor substrate and forming an epitaxial layer over the gettering layer.

SUMMARY OF THE INVENTION

An object of the present invention is to provide a solution to the above mentioned problems which is less complex and more effective than known solutions. The inventors have found that the presence of nitrogen in the silicon epitaxial layer at a concentration of $1 \times 10^{16}$ atoms/cm$^3$ or more and $1 \times 10^{20}$ atoms/cm$^3$ or less reduces the nucleation and propagation of dislocations. Moreover, nitrogen incorporated into the silicon epitaxial layer in accordance with the present invention is readily accessible for oxygen-nitrogen interaction, which allows the formation of an oxygen-enriched region having an oxygen peak-concentration in a certain depth from the surface of the epitaxial layer. The oxygen-enriched region exhibits gettering activity for metallic impurities.

DETAILED DESCRIPTION OF THE PREFERRED EMBODIMENTS

Figure 1:
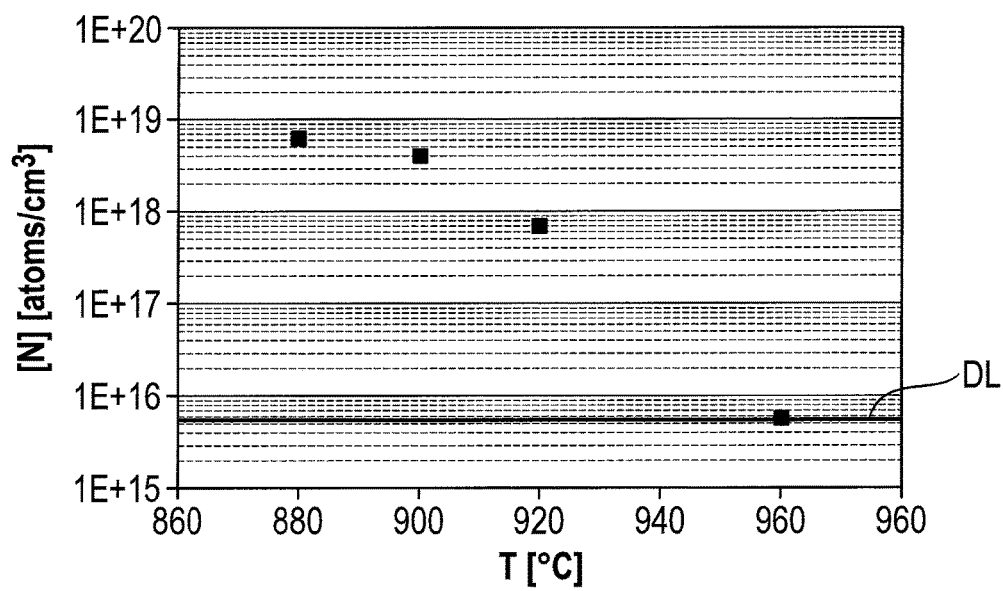
FIG. 1 is a diagram displaying the concentration of nitrogen in the silicon epitaxial layer over the deposition temperature.

According to a first aspect, the claimed invention is directed to an epitaxial wafer, comprising a silicon substrate wafer having a first side and a second side, and a silicon epitaxial layer deposited on the first side of the silicon substrate wafer, and optionally one or more additional epitaxial layers on top of the silicon epitaxial layer, the silicon epitaxial layer being doped with nitrogen at a concentration of $1 \times 10^{16}$ atoms/cm$^3$ or more and $1 \times 10^{20}$ atoms/cm$^3$ or less, or at least one of the one or more additional epitaxial layers being doped with nitrogen at a concentration of $1 \times 10^{16}$ atoms/cm$^3$ or more and $1 \times 10^{20}$ atoms/cm$^3$ or less, or the silicon epitaxial layer and at least one of the one or more additional epitaxial layers being doped with nitrogen at a concentration of $1 \times 10^{16}$ atoms/cm$^3$ or more and $1 \times 10^{20}$ atoms/cm$^3$ or less.

The at least one of the one or more additional epitaxial layers which is doped with nitrogen is preferably a further silicon epitaxial layer. Each of the additional epitaxial layers can be further silicon epitaxial layers.

According to a further aspect, the invention is directed to an epitaxial wafer according to the first aspect, wherein the silicon epitaxial layer is doped with nitrogen and an additional epitaxial layer deposited on top of the silicon epitaxial layer is not doped with nitrogen.

According to a further aspect, the invention is directed to an epitaxial wafer according to the first aspect, wherein the silicon epitaxial layer is not doped with nitrogen and an additional epitaxial layer deposited on top of the silicon epitaxial layer is doped with nitrogen.

According to a further aspect, the invention is directed to an epitaxial wafer according to the first aspect, wherein the silicon epitaxial layer is deposited on the silicon substrate wafer to completely or partially cover the silicon substrate wafer. The presence of the silicon epitaxial layer on the substrate wafer can be restricted to regions where electronic device structures are built.

According to a further aspect, the invention is directed to an epitaxial wafer according to the first or to a further aspect, wherein the silicon epitaxial layer is additionally doped with at least one electrically active dopant belonging to group III or group V of the periodic table of elements. Preferred dopants are boron, phosphorous, arsenic and antimony.

According to further aspect, the invention is directed to an epitaxial wafer according to the first aspect or to a further aspect, wherein the silicon epitaxial layer doped with nitrogen, or the at least one of the one or more additional epitaxial layers which is doped with nitrogen, or the silicon epitaxial layer doped with nitrogen and the at least one of the one or more additional epitaxial layers which is doped with nitrogen comprises an oxygen-enriched region which exhibits gettering activity for metallic impurities. The concentration of oxygen in the oxygen-enriched region has an in-depth profile comprising a peak. The peak-concentration of oxygen is located in a depth direction of the silicon epitaxial layer doped with and/or the at least one of the one or more additional epitaxial layers which is doped with nitrogen.

The peak-concentration of oxygen in the oxygen-enriched region is preferably $1 \times 10^{17}$ atoms/cm$^3$ or more and $1 \times 10^{19}$ atoms/cm$^3$ or less (new ASTM).

The distance of the peak-concentration of oxygen in the oxygen-enriched region from the interface between the silicon substrate wafer and the silicon epitaxial layer is preferably 50 nm or more and 2 μm or less. The location of the peak-concentration of the oxygen-enriched region in depth direction from the surface of the silicon epitaxial layer is preferably deeper than the depth of a region intended to be used as electronically active region.

The distance of the peak-concentration of oxygen in the oxygen-enriched region from an interface between the at least one of the one or more additional epitaxial layers which is doped with nitrogen and a lower layer adjacent thereto is preferably 50 nm or more and 2 μm or less.

The inventors found that the diffusion coefficient of nitrogen in the silicon epitaxial layer is significantly lower than the diffusion coefficient published in literature (P. Pichler, Intrinsic Point Defects, Impurities, and Their Diffusion in Silicon, Springer (2004), p. 383). The reduction of the diffusion coefficient by a factor of about 5000 suggests that nitrogen is bound in the lattice of the silicon epitaxial layer in a different manner compared to the system examined in published literature.

According to a further aspect, the invention is directed to a method for producing an epitaxial wafer according to the first aspect or to a further aspect, the method comprising providing a silicon substrate wafer having a first side and a second side; and depositing at a deposition temperature a silicon epitaxial layer on the first side of the silicon substrate wafer and optionally one or more additional epitaxial layers on top of the silicon epitaxial layer, wherein the silicon epitaxial layer, or at least one of the one or more additional epitaxial layers, or the silicon epitaxial layer and at least one of the one or more additional epitaxial layers is deposited by chemical vapor deposition in the presence of a deposition gas atmosphere containing one or more silicon precursor compounds and one or more nitrogen precursor compounds, wherein the deposition temperature is 940° C. or less and equal to or higher than a temperature which is sufficient to cause the decomposition of the one or more silicon precursor compounds and the one or more nitrogen precursor compounds in the deposition gas atmosphere; and doping the silicon epitaxial layer, or the at least one of the one or more additional epitaxial layers, or the silicon epitaxial layer and the at least one of the one or more additional epitaxial layers with nitrogen at a concentration of $1 \times 10^{16}$ atoms/cm$^3$ or more and $1 \times 10^{20}$ atoms/cm$^3$ or less during the deposition thereof.

A suitable silicon substrate wafer can be obtained, e.g. by cutting a wafer from a silicon single crystal produced by the CZ method or the FZ method, and by subjecting the edge and the sides of the cut wafer to crystal damage removal and shaping operations, e.g. lapping and/or grinding, etching and polishing.

The silicon substrate wafer has a first side (front side) and a second side (back side). It is preferred that at least the first side of the silicon substrate wafer has a polished surface. A silicon epitaxial layer is deposited on the first side of the silicon substrate wafer by chemical vapor deposition (CVD). During deposition, gases containing one or more silicon precursor compounds and one or more nitrogen precursor compounds flow over the silicon substrate wafer which is heated to a deposition temperature. The precursor compounds are thermally decomposed providing silicon and nitrogen for the growth of the silicon epitaxial layer.

For example, silicon compounds such as silane (SiH$_4$), disilane (Si$_2$H$_6$), dichlorosilane (SiH$_2$Cl$_2$) or trichlorosilane (SiHCl$_3$) can be used as silicon precursor compounds.

For example, nitrogen compounds such as ammonia (NH$_3$) or other organic compounds containing nitrogen can be used as silicon precursor compounds.

The deposition temperature is set to be equal to or higher than a temperature which is sufficient to cause the decomposition of the silicon precursor compound and the nitrogen precursor compound in the deposition gas. Moreover, the deposition temperature is set to 940° C. or less, preferably 930° C. or less.

The inventors found that a deposition temperature of more than about 940° C. causes the concentration of nitrogen in the silicon epitaxial layer to drop to values which are lower than $1 \times 10^{16}$ atoms/cm$^3$. These values are too low so as to significantly improve the capability of the silicon epitaxial layer to resist to nucleation and propagation of dislocations. An increase in deposition temperature can be compensated by increasing the flow of the one or more nitrogen precursor compounds.

Epitaxial defects related to the doping with nitrogen in accordance with the invention could not be detected through defect etching, laser scattering inspection or Cross-Sectional Transmission Electron Microscopy (XTEM).

Hereinafter, the invention is explained in more detail by referring to the drawings.

The concentration of nitrogen [N] in the silicon epitaxial layer depends on the deposition temperature T (FIG. 1). In case that the deposition temperature is 960° C. and ammonia is used as nitrogen precursor compound and dichlorosilane as silicon precursor compound, then the nitrogen concentration in the silicon epitaxial layer is considerably lower than $1 \times 10^{16}$ atoms/cm$^3$ and near the detection limit (DL) of dynamic SIMS profiling. Therefore, the concentration of nitrogen in the silicon epitaxial layer can be controlled by the deposition temperature. Lowering the deposition temperature increases the nitrogen concentration.

Figure 2:
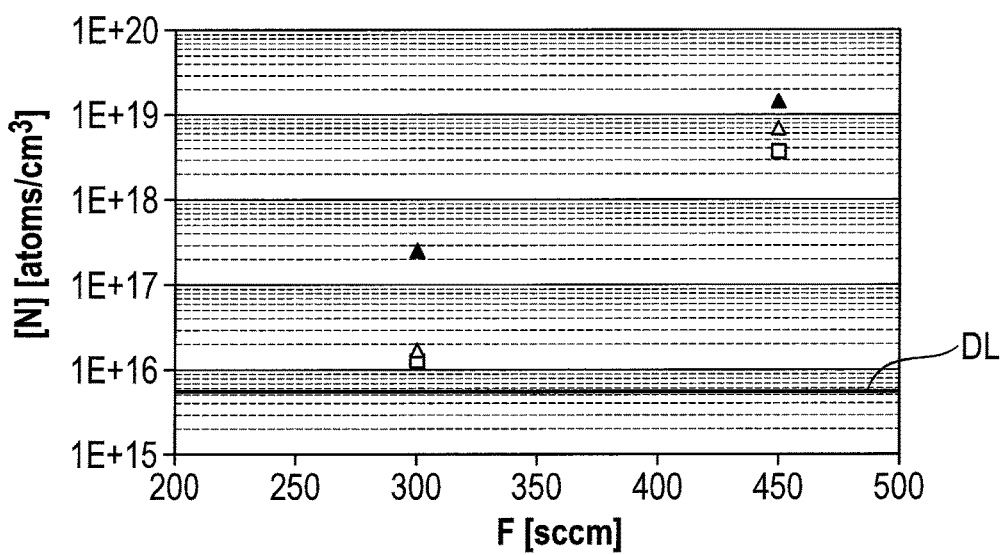
FIG. 2 displays the relationship between the concentration of nitrogen in the silicon layer and the flow rate of a gas containing the nitrogen precursor compound.

Similarly, the concentration of nitrogen [N] in the silicon epitaxial layer can be controlled by controlling the flow rate F of the gas containing the nitrogen precursor compound (FIG. 2). In case that ammonia is used as nitrogen precursor compound, increasing the flow rate by about 50% (from 300 sccm to 450 sccm) increases the nitrogen concentration in the silicon epitaxial layer by at least more than one order of magnitude. The incorporation behavior of nitrogen cannot be explained by a simple growth model. Some autocatalytic mechanism has to be taken into account.

Figure 3:
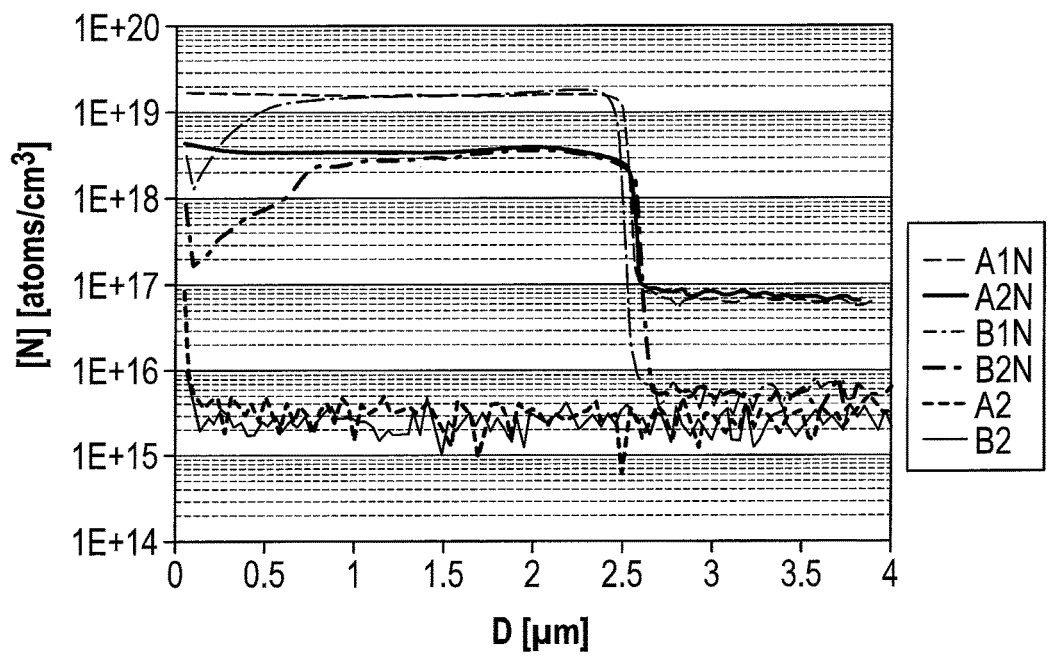
FIG. 3 shows the concentration of nitrogen in the silicon epitaxial layer in a depth direction from the surface of the silicon epitaxial layer towards the interface between the epitaxial silicon layer and the silicon substrate wafer.

FIG. 3 displays the concentration of nitrogen [N] over the depth D in a direction from the surface (D=0 μm) of the silicon epitaxial layer towards the interface (D=2.8 μm) between the silicon epitaxial layer and the silicon substrate wafer. The curve of the nitrogen concentration within the silicon epitaxial layer is almost flat (curves A1N and A2N), provided that the epitaxial wafer was not subjected to a post-epi anneal. Curves A1N and A2N represent the in-depth concentration of nitrogen in the silicon epitaxial layer and a part of the silicon substrate, after the deposition of the silicon epitaxial layer at a deposition temperature of 880° C. and 900° C., respectively, and using ammonia as nitrogen precursor. In the vicinity of the interface, the nitrogen concentration switches within a pronounced transition region having a narrow width.

When the epitaxial wafer is additionally subjected to a post-epi anneal, nitrogen is partly out-diffused at the surface of the silicon epitaxial layer. Nitrogen does not diffuse into the substrate at the same rate and the concentration of nitrogen in the transition region as measured by SIMS does not change. Curves B1N and B2N represent the in-depth concentration of nitrogen in the silicon epitaxial layer and a part of the silicon substrate, after the deposition of the silicon epitaxial layer at a deposition temperature of 880° C. and 900° C., respectively, and using ammonia as nitrogen precursor, and after a post-epi anneal. For comparison, curves A2 and B2 represent the in-depth concentration of nitrogen in the silicon epitaxial layer and a part of the silicon substrate, after the deposition of the silicon epitaxial layer at a deposition temperature of 900° C., using a deposition gas which does not include a nitrogen precursor compound, and before (A2) and after (B2) having subjected the epitaxial wafer to a post-epi anneal.

The silicon epitaxial layer which is doped with nitrogen according to the present invention constitutes an environment for oxygen-nitrogen interaction, which allows the formation of an oxygen-enriched region having an oxygen peak-concentration in a certain depth from the surface of the epitaxial layer.

Figure 4:
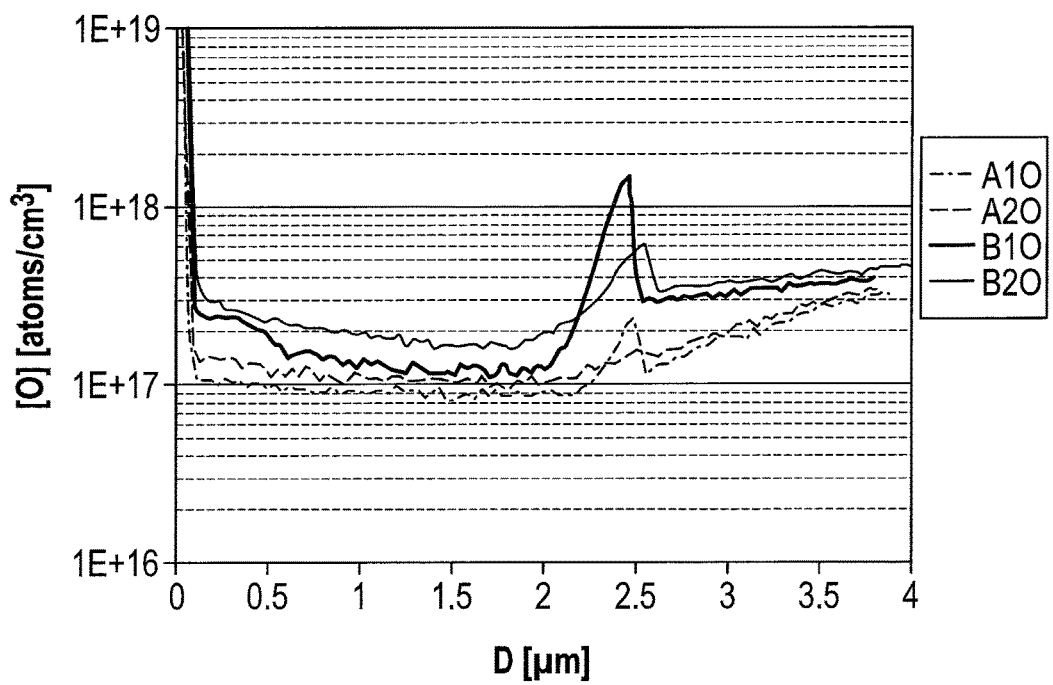
FIG. 4 shows the concentration of oxygen in the silicon epitaxial layer in a depth direction from the surface of the silicon epitaxial layer towards the interface between the epitaxial silicon layer and the silicon substrate wafer.

FIG. 4 displays the concentration of oxygen [O] over the depth D in a direction from the surface (D=0 μm) of the silicon epitaxial layer towards the interface (D=2.8 μm) between the silicon epitaxial layer and the silicon substrate wafer. Curves A1O and A2O represent the in-depth concentration of oxygen in the silicon epitaxial layer and a part of the silicon substrate, after the deposition of the silicon epitaxial layer at a deposition temperature of 880° C. and 900° C., respectively, and using ammonia as nitrogen precursor.

The oxygen-enriched region can be detected in the silicon epitaxial layer in the vicinity of the interface between the silicon epitaxial layer and the silicon substrate wafer. The oxygen-enriched region can already be detected directly after the deposition of the epitaxial layer, provided the concentration of nitrogen is not less than $1 \times 10^{19}$ atoms/cm$^3$.

Moreover, the inventors found that the peak-concentration of oxygen in the oxygen-enriched region and its width in depth direction of the silicon epitaxial layer can be further increased. For this purpose, the epitaxial wafer is subjected to a post-epi anneal. Curves B1O and B2O represent the in-depth concentration of oxygen in the silicon epitaxial layer and a part of the silicon substrate, after the deposition of the silicon epitaxial layer at a deposition temperature of 880° C. and 900° C., respectively, and using ammonia as nitrogen precursor, and after a post-epi anneal. The silicon epitaxial layer which is doped with nitrogen acts as a sink for oxygen. The silicon substrate wafer constitutes a source of oxygen diffusing into the silicon epitaxial layer and interacting with nitrogen. The diffusion of oxygen starts during the deposition of the silicon epitaxial layer and is further enhanced by a subsequent post-epi anneal.

The thermal budget of the post-epi anneal preferably corresponds to a thermal budget which is typically used for advanced CMOS processes. Therefore, the post-epi anneal may be performed by the manufacturer of the epitaxial wafer or by the manufacturer of the electronic devices.

FIGS. 7A to 7D display examples of epitaxial wafers according to the invention.

Figure 7A:
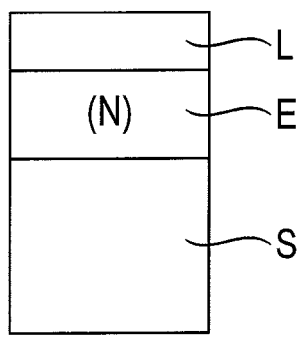
FIGS. 7A to 7D display examples of epitaxial wafers according to the invention.

The epitaxial wafer according to FIG. 7A comprises a silicon substrate wafer S, a silicon epitaxial layer E deposited on a first side of the silicon substrate wafer and an additional epitaxial layer L deposited on top of the silicon epitaxial layer. The silicon epitaxial layer E is doped with nitrogen (N) in accordance with the invention, whereas the additional epitaxial layer L is not doped with nitrogen.

Figure 7B:
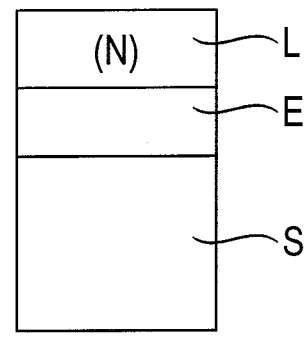

The epitaxial wafer according to FIG. 7B comprises a silicon substrate wafer S, a silicon epitaxial layer E deposited on a first side of the silicon substrate wafer and an additional epitaxial layer L deposited on top of the silicon epitaxial layer. The additional epitaxial layer L is doped with nitrogen (N) in accordance with the invention, whereas the silicon epitaxial layer E is not doped with nitrogen.

Figure 7C:
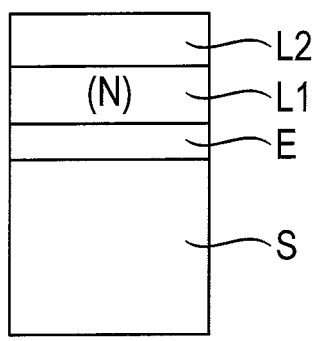

The epitaxial wafer according to FIG. 7C comprises a silicon substrate wafer S, a silicon epitaxial layer E deposited on a first side of the substrate wafer and a first additional epitaxial layer L1 deposited on top of the silicon epitaxial layer E and a second additional epitaxial layer L2 deposited on top of the first additional epitaxial layer L1. The first additional epitaxial layer L1 is doped with nitrogen (N) in accordance with the invention, whereas the silicon epitaxial layer E and the second additional epitaxial layer L2 are not doped with nitrogen.

Figure 7D:
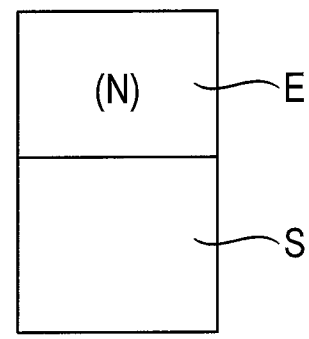

The epitaxial wafer according to FIG. 7D comprises a silicon substrate wafer S and a silicon epitaxial layer E deposited on a first side of the silicon substrate wafer. The silicon epitaxial layer E is doped with nitrogen (N) in accordance with the invention.

The strength of the silicon epitaxial layer, i.e. its ability to pin dislocations, can be investigated by applying a Vickers micro-indentation test comprising three preparation steps as described in M. Akatsuka and K. Sueoka, Jpn. J. Apply. Phys, 40, (2001) 1240.

Step 1: a Vickers mirco-indenter is used for imprinting an indent on the silicon epitaxial layer with a defined load. The indent creates a mechanically stressed zone in the silicon epitaxial layer.

Step 2: the epitaxial wafer is annealed in an Ar atmosphere for 3 hours at 1000° C. in order to promote stress release in the stressed zone by nucleation and propagation of dislocations.

Step 3: the epitaxial wafer is subjected to a Wright etch for 2 minutes in order to delineate dislocations which have nucleated and propagated during the annealing step.

Figure 5:
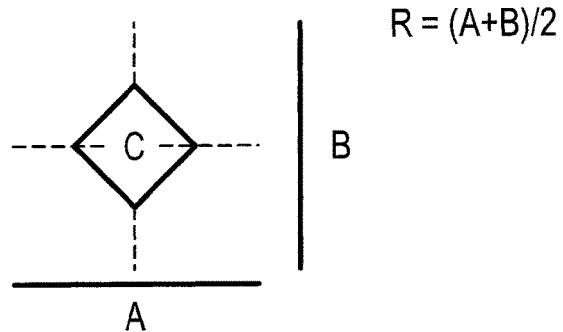
FIG. 5 is a schematic top view of a rosette which is formed after a Vickers micro-indentation test.

After the preparation steps, the indent and the dislocations form a rosette as shown in FIG. 5, and the size R of the rosette is calculated by the formula R=(A+B)/2, wherein A and B designate the distances which dislocations propagate from the center c of the indent towards opposed edges of the indent. Values of the size R which are relatively small indicate an effective inhibition of the propagation of dislocations.

The ability of the silicon epitaxial layer to keep metallic impurities away from regions for electronic device structures can be assessed by means of a getter test. The back side of the epitaxial wafer is contaminated with a defined amount of a metallic impurity, followed by a thermal treatment driving-in the impurity into the epitaxial wafer. Then, the front side of the epitaxial wafer is analyzed in order to determine the fraction of impurity which was not gettered in the silicon epitaxial layer of the epitaxial wafer. In order to exclude that significant gettering activity occurs in the silicon substrate wafer, a silicon substrate wafer is chosen which has high resistivity and low oxygen content. Such a silicon substrate wafer exhibits low intrinsic gettering capability.

Example (Vickers Micro-Indentation Test)

Three different samples of epitaxial wafers were prepared, two of them representing the present invention (sample 1 and 2) and the remaining one representing a comparative example (sample 3).

The samples representing the invention were prepared by depositing a silicon epitaxial layer on the polished front side of a silicon substrate wafer by chemical vapor deposition in the presence of a deposition gas atmosphere containing dichlorosilane as silicon precursor compound and ammonia as nitrogen precursor compound. The deposition temperature was set to 880° C. Samples 1 and 2 differed from each other by the concentration of nitrogen in the silicon epitaxial layer.

Sample 3 representing the comparative example was prepared in the same manner, except that the deposition gas did not contain a nitrogen precursor compound, i.e. the silicon epitaxial layer was not doped with nitrogen.

The prepared samples were subjected to the Vickers micro-indentation test described above. The indents were impressed with a load of 600 mN. The following table 1 summarizes the results of the indentation test.

TABLE 1

| Sample | [N] (atoms/cm$^3$) | R (µm) |
|---|---|---|
| 1 | $2 \times 10^{19}$ | 63 |
| 2 | $4 \times 10^{18}$ | 89 |
| 3 | not doped with nitrogen | 127 |

The test supports that wafers representing the invention comprise epitaxial layers having an improved ability to impede the propagation of stress induced dislocations.

Example (Getter Test)

Two different samples of epitaxial wafers were prepared, sample 4 representing the present invention and sample 5 representing a comparative example.

The epitaxial wafers according to sample 4 were prepared by depositing a silicon epitaxial layer on the polished front side of a silicon substrate wafer by chemical vapor deposition in the presence of a deposition gas atmosphere containing dichlorosilane as silicon precursor compound and ammonia as nitrogen precursor compound. The deposition temperature was set to 880° C. The silicon substrate wafer had a resistivity of 60 Ωcm and an oxygen concentration of $5 \times 10^{17}$ atoms/cm$^3$ (new ASTM).

The epitaxial wafers according to sample 5 were prepared in the same manner, except that the deposition gas did not contain a nitrogen precursor compound, i.e. the silicon epitaxial layer was not doped with nitrogen.

The back side of each sample wafer was contaminated with a Ni-containing salt by spin coating. The Ni contamination levels chosen were $1 \times 10^{10}$ atoms/cm$^2$, $1 \times 10^{11}$ atoms/cm$^2$ and $1 \times 10^{12}$ atoms/cm$^2$. Then, the sample wafers were subjected to a drive-in heat-treatment at 900° C. Afterwards, the concentration of Ni retrieved at the surface of the silicon epitaxial layer was measured by VPD-ICP-MS. The following table 2 summarizes the results of the getter test.

TABLE 2

| sample | [Ni] level of contamination | [Ni] level of recovery |
|---|---|---|
| 4 | $1 \times 10^{10}$ atoms/cm$^2$ | $1.2 \times 10^{9}$ atoms/cm$^2$ |
| 4 | $1 \times 10^{11}$ atoms/cm$^2$ | $1.3 \times 10^{9}$ atoms/cm$^2$ |
| 4 | $1 \times 10^{12}$ atoms/cm$^2$ | $4 \times 10^{10}$ atoms/cm$^2$ |
| 5 | $1 \times 10^{10}$ atoms/cm$^2$ | $5.8 \times 10^{9}$ atoms/cm$^2$ |
| 5 | $1 \times 10^{11}$ atoms/cm$^2$ | $1.9 \times 10^{10}$ atoms/cm$^2$ |
| 5 | $1 \times 10^{12}$ atoms/cm$^2$ | $2.0 \times 10^{11}$ atoms/cm$^2$ |

The results support the presence of a considerable getter activity in the silicon epitaxial layer of the epitaxial wafers pertaining to the invention.

Figure 6:
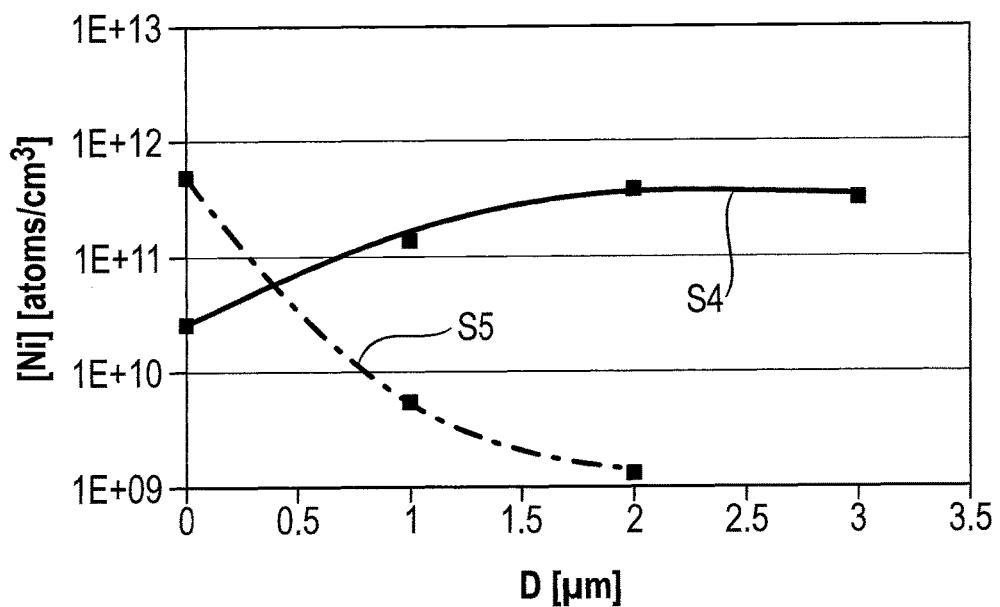
FIG. 6 displays the in-depth profile of the concentration of nickel in tested epitaxial wafers.

This result was also confirmed by analyzing the in-depth concentration of Ni in the silicon epitaxial layer and a part of the silicon substrate after the drive-in heat-treatment. A UTP (ultra-trace-profiling) method comprising step-by-step etching was used for profiling the Ni concentration at distances of 50 nm, 1 µm, 2 µm and 3 µm from the surface of the silicon epitaxial layer of the sample wafers. FIG. 6 displays the in-depth profile found in samples 4 (S4) and 5 (S5). Epitaxial wafers pertaining to the invention were capable to considerably retain Ni from diffusing to the region close to the surface of the silicon epitaxial layer. Ni is gettered in a zone that matches the oxygen-enriched region.

The capability for gettering Ni could be enhanced by subjecting epitaxial wafers representing sample 4 to a post-epi anneal (sample 6). The annealed epitaxial wafers were tested in an analogous manner. Table 3 summarizes the results of the getter test.

TABLE 3

| sample | [Ni] level of contamination | [Ni] level of recovery |
|---|---|---|
| 6 | not contaminated | $1.8 \times 10^{8}$ atoms/cm$^2$ |
| 6 | $1 \times 10^{10}$ atoms/cm$^2$ | $8.2 \times 10^{8}$ atoms/cm$^2$ |
| 6 | $1 \times 10^{11}$ atoms/cm$^2$ | $6.3 \times 10^{9}$ atoms/cm$^2$ |
| 6 | $1 \times 10^{12}$ atoms/cm$^2$ | $3.1 \times 10^{10}$ atoms/cm$^2$ |

The invention claimed is:

1. An epitaxial wafer, comprising a silicon substrate wafer having a first side and a second side, and an elemental silicon epitaxial layer deposited on the first side of the silicon substrate wafer, and optionally one or more additional epitaxial layers on top of the elemental silicon epitaxial layer, the elemental silicon epitaxial layer being doped with nitrogen at a concentration of more than $1 \times 10^{16}$ atoms/cm$^3$ and $1 \times 10^{20}$ atoms/cm$^3$ or less, or at least one of the one or more additional epitaxial layers being doped with nitrogen at a concentration of more than $1 \times 10^{16}$ atoms/cm$^3$ and $1 \times 10^{20}$ atoms/cm$^3$ or less, or the elemental silicon epitaxial layer and at least one of the one or more additional epitaxial layers being doped with nitrogen at a concentration of more than $1 \times 10^{16}$ atoms/cm$^3$ and $1 \times 10^{20}$ atoms/cm$^3$ or less.

2. The epitaxial wafer of claim 1, wherein the elemental silicon epitaxial layer is doped with nitrogen and an additional epitaxial layer deposited on top of the elemental silicon epitaxial layer is not doped with nitrogen.

3. The epitaxial wafer of claim 1, wherein the elemental silicon epitaxial layer is not doped with nitrogen and an additional epitaxial layer deposited on top of the elemental silicon epitaxial layer is doped with nitrogen.

4. The epitaxial wafer of claim 1, wherein the elemental silicon epitaxial layer completely covers the silicon substrate wafer.

5. The epitaxial wafer of claim 4, wherein the elemental silicon epitaxial layer partially covers the silicon substrate wafer.

6. The epitaxial wafer of claim 1, wherein the elemental silicon epitaxial layer is additionally doped with at least one electrically active dopant belonging to group III or group V of the periodic table of elements.

7. The epitaxial wafer of claim 1, wherein the elemental silicon epitaxial layer doped with nitrogen, or the at least one of the one or more additional epitaxial layers which is doped with nitrogen, or the elemental silicon epitaxial layer doped with nitrogen and the at least one of the one or more additional epitaxial layers which is doped with nitrogen comprises an oxygen-enriched region exhibiting gettering activities and having a peak concentration of oxygen.

8. The epitaxial wafer of claim 1, wherein the epitaxial wafer has an oxygen enriched layer having an oxygen concentration peak where the concentration of oxygen is from $1\times10^{17}$ atoms/cm$^3$ to $1\times10^{19}$ atoms/cm$^3$.

9. The epitaxial wafer of claim 8, wherein the peak oxygen concentration lies from 50 nm to 2 µm below an interface between the silicon substrate wafer and the elemental silicon epitaxial layer.

10. A method for producing an epitaxial wafer of claim 9, comprising: a) providing a silicon substrate wafer having a first side and a second side; b) depositing at a deposition temperature, an elemental silicon epitaxial layer on the first side of the silicon substrate wafer and optionally one or more additional epitaxial layers on top of the elemental silicon epitaxial layer, wherein the elemental silicon epitaxial layer, or at least one of the one or more additional epitaxial layers, or the elemental silicon epitaxial layer and at least one of the one or more additional epitaxial layers is deposited by chemical vapor deposition in the presence of a deposition gas atmosphere containing one or more silicon precursor compounds and one or more nitrogen precursor compounds, wherein the deposition temperature is 940° C. or less and equal to or higher than a temperature which is sufficient to cause the decomposition of the one or more silicon precursor compounds and the one or more nitrogen precursor compounds in the deposition gas atmosphere; and c) doping the elemental silicon epitaxial layer, or the at least one of the one or more additional epitaxial layers, or the elemental silicon epitaxial layer and the at least one of the one or more additional epitaxial layers with nitrogen at a concentration of more than $1\times10^{16}$ atoms/cm$^3$ and $1\times10^{20}$ atoms/cm$^3$ or less during the deposition thereof.

11. The epitaxial wafer of claim 8, wherein the peak oxygen concentration lies from 50 nm to 2 µm below an interface between at least one of the one or more additional epitaxial layers which is doped with nitrogen and a lower layer adjacent thereto.

12. A method for producing an epitaxial wafer of claim 8, comprising: a) providing a silicon substrate wafer having a first side and a second side; b) depositing at a deposition temperature, an elemental silicon epitaxial layer on the first side of the silicon substrate wafer and optionally one or more additional epitaxial layers on top of the elemental silicon epitaxial layer, wherein the elemental silicon epitaxial layer, or at least one of the one or more additional epitaxial layers, or the elemental silicon epitaxial layer and at least one of the one or more additional epitaxial layers is deposited by chemical vapor deposition in the presence of a deposition gas atmosphere containing one or more silicon precursor compounds and one or more nitrogen precursor compounds, wherein the deposition temperature is 940° C. or less and equal to or higher than a temperature which is sufficient to cause the decomposition of the one or more silicon precursor compounds and the one or more nitrogen precursor compounds in the deposition gas atmosphere; and c) doping the elemental silicon epitaxial layer, or the at least one of the one or more additional epitaxial layers, or the elemental silicon epitaxial layer and the at least one of the one or more additional epitaxial layers with nitrogen at a concentration of more than $1\times10^{16}$ atoms/cm$^3$ and $1\times10^{20}$ atoms/cm$^3$ or less during the deposition thereof.

13. A method for producing an epitaxial wafer of claim 1, comprising: a) providing a silicon substrate wafer having a first side and a second side; b) depositing at a deposition temperature, an elemental silicon epitaxial layer on the first side of the silicon substrate wafer and optionally one or more additional epitaxial layers on top of the elemental silicon epitaxial layer, wherein the elemental silicon epitaxial layer, or at least one of the one or more additional epitaxial layers, or the elemental silicon epitaxial layer and at least one of the one or more additional epitaxial layers is deposited by chemical vapor deposition in the presence of a deposition gas atmosphere containing one or more silicon precursor compounds and one or more nitrogen precursor compounds, wherein the deposition temperature is 940° C. or less and equal to or higher than a temperature which is sufficient to cause the decomposition of the one or more silicon precursor compounds and the one or more nitrogen precursor compounds in the deposition gas atmosphere; and c) doping the elemental silicon epitaxial layer, or the at least one of the one or more additional epitaxial layers, or the elemental silicon epitaxial layer and the at least one of the one or more additional epitaxial layers with nitrogen at a concentration of more than $1\times10^{16}$ atoms/cm$^3$ and $1\times10^{20}$ atoms/cm$^3$ or less during the deposition thereof.

14. The method of claim 13, wherein the elemental silicon epitaxial layer is deposited in the presence of the one or more nitrogen precursor compounds, and at least one of the one or more additional epitaxial layers is deposited in the absence of the one or more nitrogen precursor compounds.

15. The method of claim 13, wherein the elemental silicon epitaxial layer is deposited in the absence of the one or more nitrogen precursor compounds and at least one of the one or more additional epitaxial layers is deposited in the presence of the one or more nitrogen precursor compounds.

16. The method of claim 13, further comprising subjecting the epitaxial wafer to a post-epi anneal.

17. The method of claim 13, wherein the epitaxial wafer has an oxygen enriched layer having an oxygen concentration peak where the concentration of oxygen is from $1\times10^{17}$ atoms/cm$^3$ to $1\times10^{19}$ atoms/cm$^3$.

18. The method of claim 17, wherein the peak oxygen concentration lies from 50 nm to 2 µm below an interface between the silicon substrate wafer and the elemental silicon epitaxial layer.

19. The method of claim 17, wherein the peak oxygen concentration less from 50 nm to 2 µm below an interface between at least one of the one or more additional epitaxial layers which is doped with nitrogen and a lower layer adjacent thereto.

20. The epitaxial wafer of claim 1, having at least one epitaxial layer doped with nitrogen in an amount of from $2.5 \times 10^{17}$ atoms/cm$^3$ to less than $1 \times 10^{20}$ atoms/cm$^3$.

* * * * *